(12) United States Patent
Sløgedal et al.

(10) Patent No.: US 9,122,901 B2
(45) Date of Patent: Sep. 1, 2015

(54) SURFACE SENSOR

(75) Inventors: Øyvind Sløgedal, Hosle (NO); Geir Ivar Bredholt, Oslo (NO); Nicolai W. Christie, Hosle (NO); Anders Nåtas, Oslo (NO); Ralph W. Bernstein, Hosle (NO)

(73) Assignee: IDEX ASA, Fornebu (NO)

( * ) Notice: Subject to any disclaimer, the term of this patent is extended or adjusted under 35 U.S.C. 154(b) by 347 days.

(21) Appl. No.: 13/519,679

(22) PCT Filed: Dec. 28, 2010

(86) PCT No.: PCT/EP2010/070787
§ 371 (c)(1),
(2), (4) Date: Sep. 19, 2012

(87) PCT Pub. No.: WO2011/080262
PCT Pub. Date: Jul. 7, 2011

(65) Prior Publication Data
US 2013/0194071 A1    Aug. 1, 2013

Related U.S. Application Data

(60) Provisional application No. 61/290,630, filed on Dec. 29, 2009.

(30) Foreign Application Priority Data

Dec. 29, 2009    (NO) .................................. 20093601

(51) Int. Cl.
*H04B 1/00*    (2006.01)
*G06K 9/00*    (2006.01)

(52) U.S. Cl.
CPC .................................. *G06K 9/0002* (2013.01)

(58) Field of Classification Search
CPC .................................................. G06K 9/0002
See application file for complete search history.

(56) References Cited

U.S. PATENT DOCUMENTS 4,353,056 A    10/1982 Tsikos
(Continued)

FOREIGN PATENT DOCUMENTS

CN    1841280 A    10/2006
(Continued)

OTHER PUBLICATIONS

Han, Ji-song et al., "Thermal characterization of micro heater arrays on a polyimide film substrate for fingerprint sensing applications", Journal of Micromechanics and Microengineering, vol. 15, No. 2, Feb. 1, 2005, pp. 282-289.
(Continued)

*Primary Examiner* — Ojiako Nwugo
(74) *Attorney, Agent, or Firm* — Rothwell, Figg, Ernst & Manbeck PC

(57) ABSTRACT

The invention relates to a sensor for detection of properties and structures of an organic tissue and its surface, e.g. a fingerprint sensor comprising a chosen number of sensor electrodes at chosen positions for coupling to a finger tissue and its surface having a size less or comparable to the size of the structures, characteristics or properties of the finger tissue or surface, and a processing unit including electronic circuitry connected to said electrodes for detection of the voltage at, or the current flow in the electrodes, thereby providing for detection and collection of information of related capacitance, impedance, electromagnetic field, fingerprint, tissue aliveness or other biometric, physical, physiological, thermal or optical or characteristics or properties of the tissue or its surface positioned over the electrodes, the processing unit being mounted on one side of a substrate and the electrodes being embedded in said substrate, the substrate including through going first, second and third conductive paths between said sensor electrodes and said measurement circuitry. The substrate is made from a polymer material such as Polyimide, implemented as a rigid or a flexible multi layer build-up substrate, said first, second, and third conductive paths are constituted by through going substrate sections of a chosen size and material.

14 Claims, 9 Drawing Sheets

(56) References Cited

U.S. PATENT DOCUMENTS

| | | | |
|---|---|---|---|
| 4,582,985 A | 4/1986 | Löfberg | |
| 5,371,404 A | 12/1994 | Juskey et al. | |
| 5,399,898 A | 3/1995 | Rostoker | |
| 5,403,700 A | 4/1995 | Heller et al. | |
| 5,515,298 A | 5/1996 | Bicz | |
| 5,598,032 A | 1/1997 | Fidalgo | |
| 5,745,046 A * | 4/1998 | Itsumi et al. | 340/5.83 |
| 5,844,287 A | 12/1998 | Hassan et al. | |
| 5,862,248 A | 1/1999 | Salatino et al. | |
| 5,963,679 A | 10/1999 | Setlak | |
| 6,020,749 A | 2/2000 | Morris et al. | |
| 6,026,564 A | 2/2000 | Wang et al. | |
| 6,055,324 A | 4/2000 | Fujieda | |
| 6,069,970 A | 5/2000 | Salatino et al. | |
| 6,234,031 B1 * | 5/2001 | Suga | 73/862.474 |
| 6,289,114 B1 | 9/2001 | Mainguet | |
| 6,512,381 B2 | 1/2003 | Kramer | |
| 6,522,773 B1 | 2/2003 | Houdeau | |
| 6,628,812 B1 | 9/2003 | Setlak et al. | |
| 6,683,971 B1 | 1/2004 | Salatino et al. | |
| 6,714,666 B1 | 3/2004 | Morimura et al. | |
| 6,765,274 B2 | 7/2004 | Honda | |
| 6,785,407 B1 | 8/2004 | Tschudi et al. | |
| 6,838,362 B2 | 1/2005 | Mastromatteo et al. | |
| 6,848,617 B1 | 2/2005 | Fries et al. | |
| 6,881,605 B2 | 4/2005 | Lee et al. | |
| 7,028,893 B2 | 4/2006 | Goodman et al. | |
| 7,053,633 B2 | 5/2006 | Hara | |
| 7,054,471 B2 | 5/2006 | Tschudi | |
| 7,081,765 B2 | 7/2006 | Miyasaka et al. | |
| 7,090,139 B2 | 8/2006 | Kasuga et al. | |
| 7,110,577 B1 | 9/2006 | Tschudi | |
| 7,129,926 B2 | 10/2006 | Mathiassen et al. | |
| 7,184,581 B2 | 2/2007 | Johansen et al. | |
| 7,227,213 B2 | 6/2007 | Mastromatteo et al. | |
| 7,251,351 B2 | 7/2007 | Mathiassen et al. | |
| 7,278,025 B2 | 10/2007 | Saito et al. | |
| 7,298,875 B2 | 11/2007 | Kim et al. | |
| 7,308,121 B2 | 12/2007 | Mathiassen et al. | |
| 7,331,528 B2 | 2/2008 | Reid et al. | |
| 7,606,398 B2 | 10/2009 | Nysæther et al. | |
| 7,848,798 B2 | 12/2010 | Martinsen et al. | |
| 7,992,789 B2 | 8/2011 | Borracci | |
| 8,195,285 B2 | 6/2012 | Martinsen et al. | |
| 2002/0014651 A1 | 2/2002 | Thomas | |
| 2002/0125437 A1 | 9/2002 | Izumi et al. | |
| 2002/0152048 A1 | 10/2002 | Hayes | |
| 2003/0102874 A1 * | 6/2003 | Lane et al. | 324/662 |
| 2003/0161511 A1 * | 8/2003 | Vermesan et al. | 382/124 |
| 2005/0100938 A1 | 5/2005 | Hofmann et al. | |
| 2005/0101054 A1 | 5/2005 | Mastromatteo et al. | |
| 2005/0205985 A1 * | 9/2005 | Smith et al. | 257/688 |
| 2005/0247559 A1 | 11/2005 | Frey et al. | |
| 2006/0267385 A1 | 11/2006 | Steenwyk et al. | |
| 2007/0196002 A1 | 8/2007 | Choi et al. | |
| 2007/0220273 A1 | 9/2007 | Campisi | |
| 2008/0002867 A1 | 1/2008 | Mathiassen et al. | |
| 2008/0030207 A1 * | 2/2008 | Vermesan et al. | 324/687 |
| 2008/0069413 A1 * | 3/2008 | Riedijk et al. | 382/124 |
| 2008/0185193 A1 | 8/2008 | Lin | |
| 2008/0223925 A1 | 9/2008 | Saito et al. | |
| 2009/0252385 A1 | 10/2009 | Dean et al. | |
| 2010/0117224 A1 * | 5/2010 | McElrea et al. | 257/723 |
| 2010/0237490 A1 * | 9/2010 | Chu et al. | 257/692 |
| 2010/0321197 A1 * | 12/2010 | Wong et al. | 340/691.3 |
| 2011/0182488 A1 * | 7/2011 | Bredholt et al. | 382/124 |

FOREIGN PATENT DOCUMENTS

| | | |
|---|---|---|
| CN | 1889103 A | 1/2007 |
| CN | 1942853 A | 4/2007 |
| CN | 101383704 A | 3/2009 |
| CN | 101515214 A | 8/2009 |
| DE | 1998131565 | 10/1999 |
| EP | 0779497 A2 | 6/1997 |
| EP | 813164 A1 | 12/1997 |
| EP | 0919947 A2 | 6/1999 |
| EP | 1256899 A1 | 11/2002 |
| EP | 1286298 A2 | 2/2003 |
| EP | 1316913 A2 | 6/2003 |
| JP | 62-226030 A | 10/1987 |
| JP | 10-020992 A | 1/1998 |
| JP | 11-164824 A | 6/1999 |
| JP | 2000-57328 A | 2/2000 |
| JP | 2001-077342 A | 3/2001 |
| JP | 2003-511799 A | 3/2003 |
| JP | 2006-184104 A | 7/2006 |
| JP | 2006-517023 A | 7/2006 |
| JP | 2007-010338 A | 1/2007 |
| JP | 2007-018168 A | 1/2007 |
| JP | 2008-134836 A | 6/2008 |
| JP | 2009-516295 A | 4/2009 |
| WO | 9858342 A1 | 12/1998 |
| WO | WO-99/12404 A1 | 3/1999 |
| WO | WO-00/13130 A2 | 3/2000 |
| WO | 01/27868 A1 | 4/2001 |
| WO | WO-01/99035 A2 | 12/2001 |
| WO | WO-03/049012 A2 | 6/2003 |
| WO | WO 2004/049942 A1 | 6/2004 |
| WO | 2004/066693 A1 | 8/2004 |
| WO | WO 2004/084300 A1 | 9/2004 |
| WO | WO-2006/041780 A1 | 4/2006 |
| WO | 2007058727 A1 | 5/2007 |
| WO | WO 2007/089207 | 8/2007 |

OTHER PUBLICATIONS

Bauer, T., "First High Volume Via Process for Packaging and Integration of MEMS / CMOS," Silex Microsystems, Jarfalla, Sweden, 6 pages.

Isa, Sabine, "International Search Report" for PCT/EP2010/070787, as mailed Mar. 28, 2011, 4 pages.

Taiwanese Search Report dated Jan. 16, 2015, TW Application No. 099146099, Filed: Dec. 27, 2010, 1 page.

Chinese Office Action dated Dec. 3, 2014, CN Application No. 2014112801136520, 9 pages.

Japanese Office Action dated Dec. 2, 2014, JP Application No. 2012-549090, 15 pages.

Chinese Office Action dated Dec. 1, 2014, CN Application No. 2014112601288820, 7 pages.

Japanese Office Action dated Sep. 2, 2014, JP Application No. 2012-549092, 8 pages.

Baide et al., "Overview of Multichip Technology," Electronic Materials Handbook, ASM International, vol. 1, pp. 144-145, 297-305, 320-321, 438-442 (ISNBN 0-87170-285-1).

Baumgartner et al., "Advanced Multichip Module Technologies," Proceedings of the 9th European Hybrid Microelectronics Conference, ISHMs, International Society for Hybrid Microelectronic, pp. 200-207 (June 1993).

Drueke, "A Sealing Process for Printed-Through-Holes," Proceedings of the 9th European Hybrid Microelectronics Conference, ISHM, International Society for Hybrid Microelectronics, pp. 115-122 (Jun. 1993).

Nonfinal Office Action issued in U.S. Appl. No. 14/608,598, 23 pages (Apr. 10, 2015).

* cited by examiner

SURFACE SENSOR

CROSS-REFERENCE TO RELATED APPLICATIONS

This patent application claims priority from and incorporates by reference the entire disclosure of U.S. Provisional Patent Application No. 61/290,630, filed on Dec. 29, 2009.

The present invention relates to a sensor for detection of structures and properties of organic tissue or its surface, especially a fingerprint sensor, comprising a chosen number of sensor electrodes at chosen positions for electrical and mechanical coupling to a finger surface and its tissue, having a size comparable to the size of the structures, characteristics, or properties of the finger tissue or surface.

In the recent years, biometrics, and especially fingerprint sensors, have become common for the purpose of verifying the identity of a person, e.g. at immigration control, at airports as well as with personal devices such as laptops etc. The present solutions still have a number of disadvantages. Fingerprint sensors used in airports and immigration control are large and too expensive for many applications, smaller sensors seen in portable devices are often silicon based solutions with limited robustness and challenging electronic interconnections. Traditional silicon production techniques for such sensors often result in solutions for electrical interconnection features interfering with the physical finger interface of the device. Recessed mounting of the sensor in a consumer application is often implemented to improve these shortcomings, but may not be the optimal solution both with respect to esthetical design and protection from dirt and moisture. Sensor size, both volume and area, along with the rigid properties of silicon, significantly limits the feasibility of integrating fingerprint devices in thin and flexible applications such as smartcards.

A fingerprint sensor which may be flush mounted in the same plane as the surface of the product it is mounted into is described in U.S. Pat. No. 7,251,351, in which a set of first electrodes/sensor elements are positioned on one side of an insulating substrate provided with through-substrate-via conductors. The substrate may be made from glass, ceramics or other insulating materials. In WO 03/049012 a substrate made from a multilayered or laminate PCB process is described being based on a subtractive PCB process in which, as with the abovementioned US patent, is based on the removal of materials, e.g. by etching, which has relatively low resolution and thus not sufficiently good for the small dimensions and tolerances of fingerprint sensors. If the dimensions such as the layer thickness are not sufficiently accurate they may affect the measurements and reduce the accuracy of the sensor unit.

Thus it is an object of the present invention to offer a thin, flexible fingerprint sensor realized by well established, high volume, low cost manufacturing processes, while also allowing the sensor surface to be positioned flush with the surface of the device in which it is mounted. This is accomplished with a fingerprint sensor as stated above being characterized as described in the independent claims.

The fingerprint sensor is thus manufactured using additive or semi-additive build-up processes to deposit dielectrics and conductors in layers to form a substrate with through going conductive paths, having embedded sensor electrodes for coupling to the finger surface on one side and with the processing unit well protected on the opposite side. The substrate may be manufactured using liquid or dry film dielectrics alternated with layers of conductive materials deposited through sputter, spray or other plating technology. Starting with a dielectric layer deposited on a mandrel, for instance glass, the first dielectric layer is ensured a high degree of flatness. Subsequent layers of conductive material and dielectrics are added using photo lithography and corresponding mask sets to define required section features. Building the layers from the finger interface side of the sensor to the rear processing unit interface side while still attached to the mandrel ensures dimensional stability of the substrate will minimizing feature and alignment tolerances. The finished substrate may be post-processed while still attached to the mandrel, or peeled off to reveal the first deposited layer. In the preferred embodiment of the invention a liquid polymer such as polyimide is used on a flat glass surface thus obtaining an improved accuracy in the dimensions of the sensor unit, especially the thickness and thus the contribution of the substrate structure on the provided measurements.

An alternative to the above mentioned process is to reverse the layer processing sequence. Instead of first depositing the top finger interface layer onto a glass plate, one or multiple layers are deposited onto a PCB type core. The core may be pre fabricated with a rear side processing unit interface and internal layers for signal redistribution and shielding. The front side of the PCB type core may then be post processed using the build-up processes described above to produce the small, high tolerance, features required for the fingerprint sensor design. The last layer to be deposited will in this process constitute the finger interface. This processing alternative is often utilized to manufacture IC substrates or Flip Chip substrates, and is often referred to as Micro PCB. An alternative process is where a dry film replaces the liquid polyimide material with metal covered films such as Kapton® where the conductive sections are processed using lithography and various etching, laser, and via filling techniques thus providing the conductor leads or paths as discussed in the abovementioned publications. Multiple layers are achieved by laminating such individual sheets together. A combination of dry and wet processes, with or without a core is also possible.

In the following descriptions, the term "detection of voltage or current" will be understood by a person skilled in the art as a method for detection and collection of information about the related capacitance, impedance, electromagnetic field, fingerprint or other biometric, physical, physiological, thermal or optical or characteristics or properties of the tissue or its surface positioned over the electrodes of the sensor. Also, the term coupling is understood as including both direct electrical contact between two parts as well as capacitive or inductive coupling of two parts separated physically by a dielectric material.

The invention will be discussed more in detail below with reference to the accompanying drawings, illustrating the invention by way of examples.

Figures 13A, 13B:
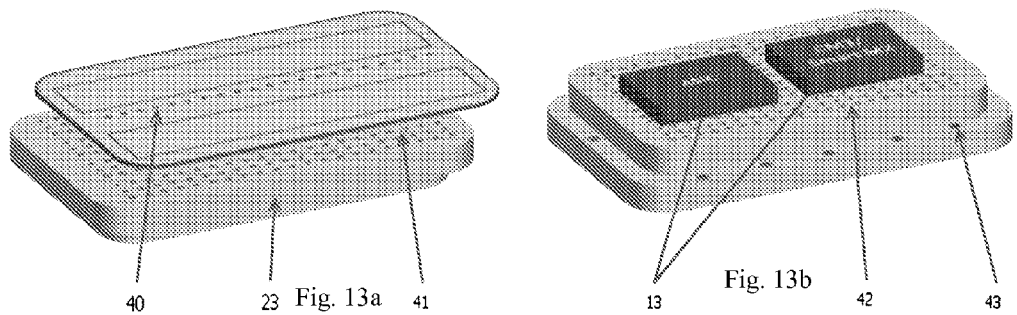

FIG. 13a,b illustrates a fingerprint sensor according to the invention positioned on an additional substrate for mounting in a credit card.

Figure 14:
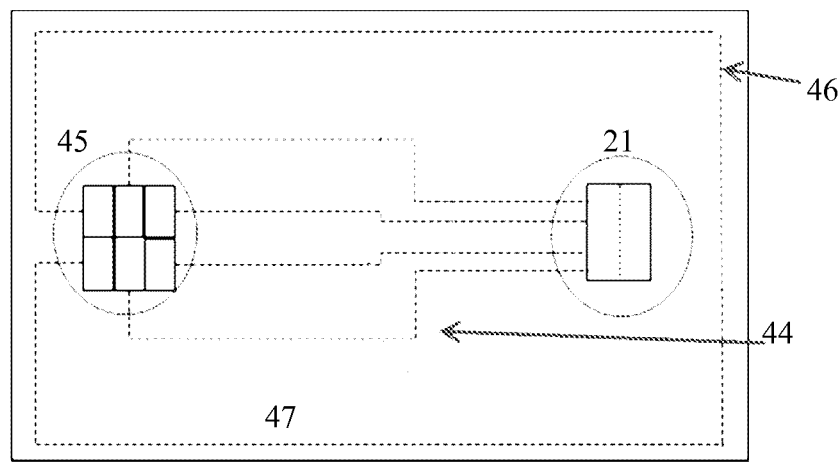

FIG. 14 illustrates a fingerprint sensor mounted in a smart card.

Figure 1:
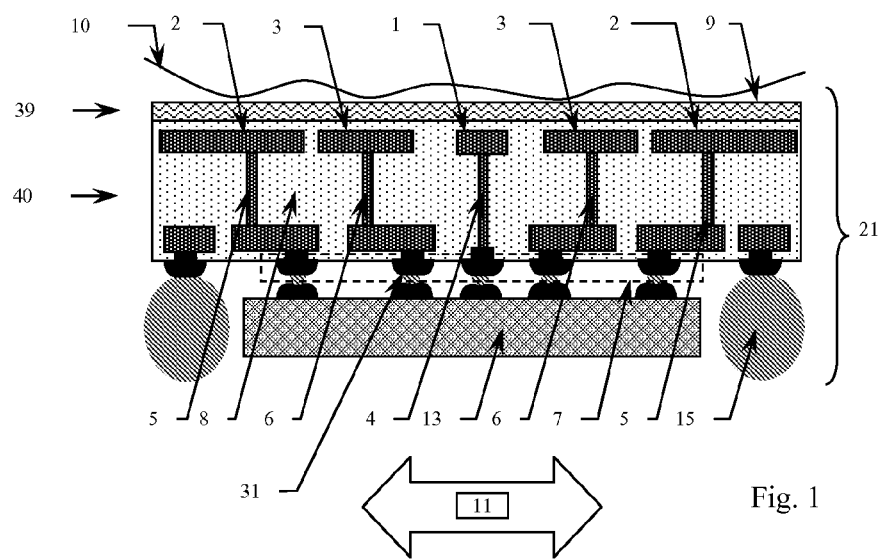
FIG. 1 illustrates the cross section of a preferred embodiment of the invention.

FIG. 1 illustrates the cross section of the preferred embodiment of the fingerprint sensor 21 according to the invention. Primarily the sensor unit is constituted by a flexible unit 40 including a dielectric, possibly organic, substrate 8 with embedded conductive sections 1,2,3,4. First electrodes 1 are connected to first conductive paths 4, created by sequentially depositing layers of conductive and dielectric materials forming unbroken conductive paths of conductive sections from the first electrodes, through the substrate 8 and redistributed to coupling points 31 for connecting to the processing unit interfaces 7 on the reverse side. This is provided in a layered structure from the contact surface 9 being touched by the finger 10, the layered structure being constituted by a first dielectric layer 39 covering the first electrodes 1 (also called sensor elements in the mentioned patent publications) and other (second and third) electrodes 2,3 in a second layer being separated by a dielectric material 8, and a third layer comprising the conductor leads 4,5,6 to the coupling points 31. This structure is preferably built in a build-up process as mentioned above and may include several additional steps for introducing additional layers, e.g. if the required positions of the coupling points to the processing unit is different from the positions of the electrodes.

The finger interface, coupling area, of the first electrodes 1 are chosen so that they are smaller than structures in a typical finger surface 10, enabling the capability to distinguishing between valleys and ridges in the surface which typically have a pitch of approximately 150-600 µm. A typical area of the first electrodes may therefore be approximately 2000-20000 µm², electrically insulated from adjacent electrodes by the substrate dielectric in a thickness of 1-30 µm. Other versions may be contemplated varying electrode size, shape and pitch. In a realized embodiment the electrode pitch is 67.5 µm, in a rectangular shape with an area of 6500 µm². The conductive paths 4 may vary greatly in size and shape depending on routing and/or process constraints as well as signal integrity requirements. Current manufacturing capabilities are at below 1 µm for both trace widths and thicknesses (L/S), and layer to layer interconnecting conductive paths with cross sectional areas of 10-2000 µm². A current embodiment is realized with L/S of 15/15 µm and layer to layer interconnects of 700 µm²

The preferred embodiment of the invention involves galvanic isolation between the finger surface and the sensor electrodes and thus the sensor electrodes are embedded in the substrate below the finger interface surface, the substrate dielectric 8 providing the required dielectric medium between the finger surface and first electrodes. Preferably a surface coating layer 9 is added for improved mechanical and chemical protection, controlled friction, improved image quality, enhanced cosmetics or other purposes. The performance coating may be made from a carbon based materials such as Diamond Like carbon (DLC) or amorphous diamond, as described in EP0779497 and U.S. Pat. No. 5,963,679. The thickness of the substrate dielectric and performance coating layers may be chosen to provide suitable detection conditions, for example in the range of 500 nm or more. Exposed electrodes without dielectrics providing direct electrical contact with the finger may be implemented for improved detection conditions, like increased signal levels.

On the opposite side of the finger interface surface, the fingerprint sensor substrate is in a per se known way provided with electrical signal interfaces 7 for connecting the signal processing unit 13 to the conductive paths. These interfaces may be manufactured using well known technology for under-bump metallization (UBM) and provide a base for solder or glue based interconnection solutions to the processing unit. Similarly external IO connections 15 are provided.

According to the preferred embodiment the substrate is also provided with a second electrode 2 connected to a second conductive path 5 implemented in a similar manner as the first electrode and first conductive path but having larger electrode dimensions so as to be significantly larger than the features in the finger surface. Thus the coupling between the second electrode and the finger is not significantly affected by the structures in the surface of the finger. In this case the processing unit is adapted to detect the voltage at or the current flow in each of a multitude of first electrodes 1 provided by the first and second electrodes as the processing unit also applies a static or varying voltage between the first and second electrodes and detects the voltage and current in a per se known way, e.g. by applying a voltage between the second electrode and ground and by detecting the current flow from the finger into the first electrode, or voltage relative to ground at the first electrode. Due to the differences in size only the structures of the finger close to the first electrodes will affect the voltage or current sensed or detected by the sensor. In this embodiment of the invention it is also possible to vary the embedded depth of the electrodes, hence changing the dielectric thickness and coupling characteristics in order to optimize the detection conditions, like sensitivity, contrast, dynamic signal range or other parameters for the sensor electrodes 1, 2 and 3 and/or the remainder of the substrate 8.

According to the preferred embodiment the substrate is also provided with a third electrode 3 connected to a third conductive path 6 implemented in a similar manner as the first electrode and first conductive path. The third electrode may vary in size from smaller than, to significantly larger than the surface feature size of the finger. The third electrode may replicate the functionality of the first or second electrodes or be independently electrically exited, modulated, electrically left floating, or connected to ground as discussed in U.S. Pat. No. 7,606,398. The third electrode may also be implemented in such a way that a capacitive coupling to individual 1$^{st}$ electrodes may be utilized in a calibration or circuit test routine as described in U.S. Pat. No. 7,251,351B2. Other alternatives may also be contemplated, e.g. with a third conductor (not shown) close to the first conductor leads/conductive sections and with a comparable size such as the solution described in U.S. Pat. No. 6,512,381. The fingerprint sensor is designed as a swipe sensor where the surface to be measured is expected to traverse the electrodes in the swipe direction 11.

Figure 2:
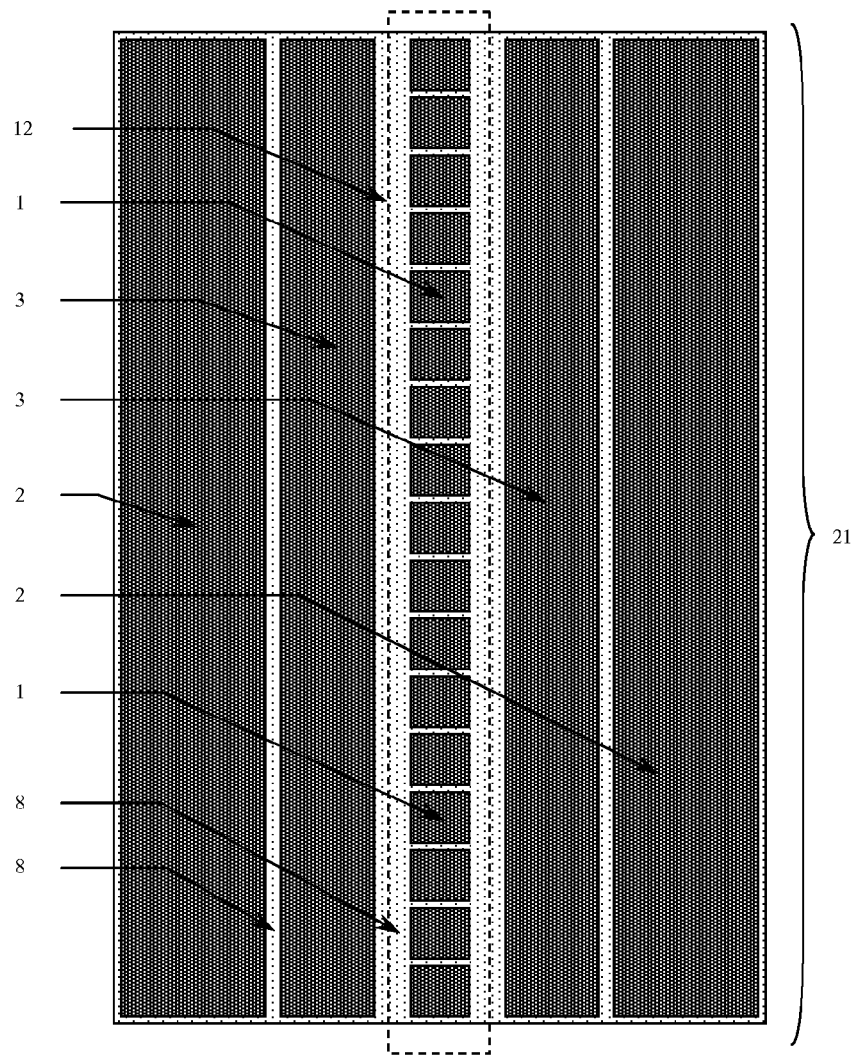
FIG. 2 illustrates a linear fingerprint sensor layout as seen from above.

FIG. 2 illustrates the layout of a stripe shaped fingerprint sensor 21 constituted by an essentially linear array of sensor electrodes 12 wherein each first electrode 1 is related to one first conductive path 4. Spanning the sensor array 12 are two stimulation or drive electrodes 2, related to before mentioned second conductive paths, thus ensuring a uniform voltage distribution across the finger, and the variation in the detected signal from the sensor array being mainly caused by variations in the structure of the finger in close vicinity to the array.

In the preferred embodiment of FIG. 2 the layout also includes two third electrodes 3, in this instance used for a (digital and analog) ground connection, thus also providing ESD protection. These electrodes may also be related to before mentioned third conductive paths through the substrate. The embedded depth of these electrodes may be varied similarly to the first and second electrodes to increase the probability of ESD events to discharge to ground. Other solutions for providing ESD protection may be realized by implementation of diode structures connected to the conductive paths of the substrate. Alternatively a discrete component such as an ESD protection diode may be connected between the drive electrode and ground, internally embedded in the substrate or externally connected for instance by flip-chip assembly.

According to an alternative embodiment of the sensor layout illustrated in FIG. 2 the sensor array may be constituted by one or multiple linear arrays of electrodes, possibly shifted across the swipe direction providing a staggered structure and improving the resolution in the measurements. Multiple sensor arrays may also allow for reconstructing a fingerprint image by stitching as described in U.S. Pat. No. 6,289,114 or for measuring the movement of the finger over the sensor as described in U.S. Pat. No. 7,054,471.

According to an alternative embodiment the second, third, or both electrodes may be provided with interfaces to external IO connections 15 shown in FIG. 1 for implementation outside the substrate, with the advantage of reducing the substrate material area as discussed in U.S. Pat. No. 6,628,812 and U.S. Pat. No. 6,683,971.

Additional electrodes and circuitry may be embedded in the sensor 21, for example for measuring the relative movement of the finger across the surface, as described in U.S. Pat. No. 7,251,351 and U.S. Pat. No. 7,110,577, or for navigation or driving a pointer on a screen, as described in U.S. Pat. No. 7,129,926 and U.S. Pat. No. 7,308,121 or for measuring other biometric properties of the finger, like aliveness detection.

Figure 3:
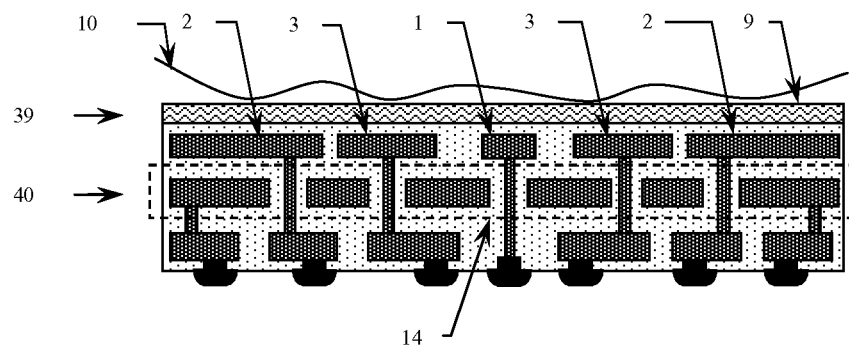
FIG. 3 illustrates the cross section of a second embodiment of the invention.

According to an alternative embodiment in FIG. 3 an additional internal layer of conductive sections 14 is included for shielding purposes. The shield layer is positioned between the electrodes and any conductive sections used for lateral signal redistribution to the processing unit interfaces. Connecting all or sections of this shield layer to ground will protect the processing unit interfaces and signal redistribution sections from electromagnetic interference or inductive or capacitive electrical coupling from the electrodes and finger surface, and vice versa.

Figure 4:
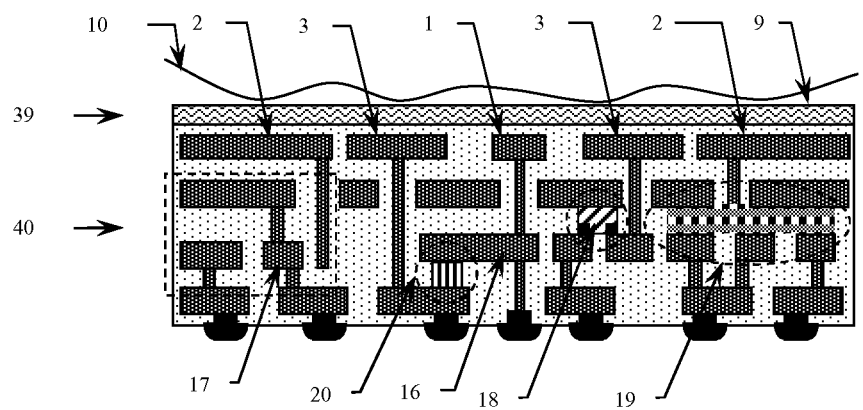
FIG. 4 illustrates the cross section of a third embodiment of the invention.

According to an alternative embodiment in FIG. 4, one or more additional internal layers 16 of conductive sections may be included to facilitate various embedded features.

An additional layer may be included to facilitate improved signal redistribution with additional degrees of freedom to route conductive paths 17.

One or more additional internal layers of conductive sections may be included to facilitate various embedded components 18. A discrete component may be placed on the last deposited layer, connection terminal(s) up, fixed with glue or by other means before the next dielectric layer is deposited. The subsequent conductive section layer deposition is prepared with a mask including openings at the required connection positions of the discrete component. The conductive material deposition process will fuse to the appropriate discrete component terminals and connect to the appropriate conductive paths.

The alternative embodiment in FIG. 4 also illustrates how organic or printable electronic circuits 19 may be implemented. The patternable dielectric layer 16 may be used as a base medium for such a deposition process. These special circuits are connected to underlying conductive sections directly through their deposition processes, or by fusing to the subsequent conductive layers by its deposition processes.

Utilizing the patternable dielectric to create an intentional void, a gas filled volume between two conductive sections, may be used as a spark gap 20 to provide a high voltage discharge path, and to dissipate electrical charge to ground. ESD protection may hence be improved when incorporated into the conductive paths between electrodes and the processing unit.

Figure 5:
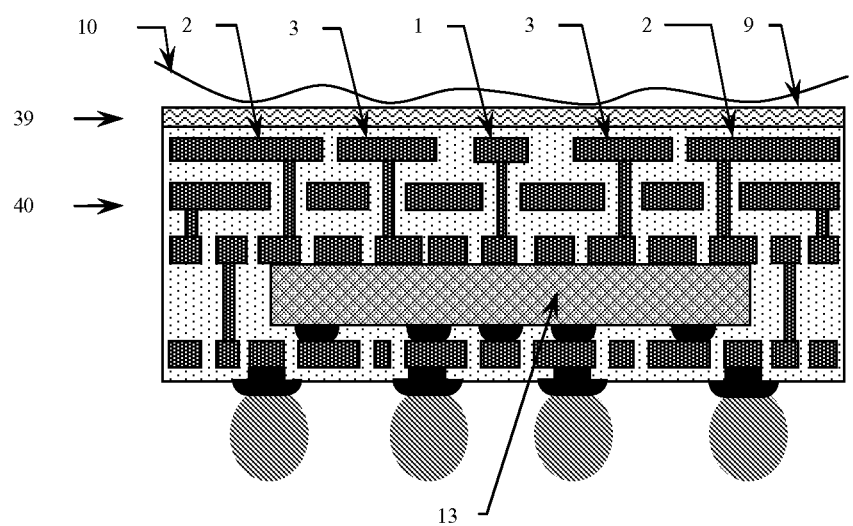
FIG. 5 illustrates the cross section of a forth embodiment of the invention.

The alternative embodiment in FIG. 5 is a special case of previously described embedded discrete components 18 of FIG. 4. In this embodiment the whole processing unit 13 is embedded in the dielectric, as opposed to flip chip mounted as depicted in FIG. 1.

Figure 6:
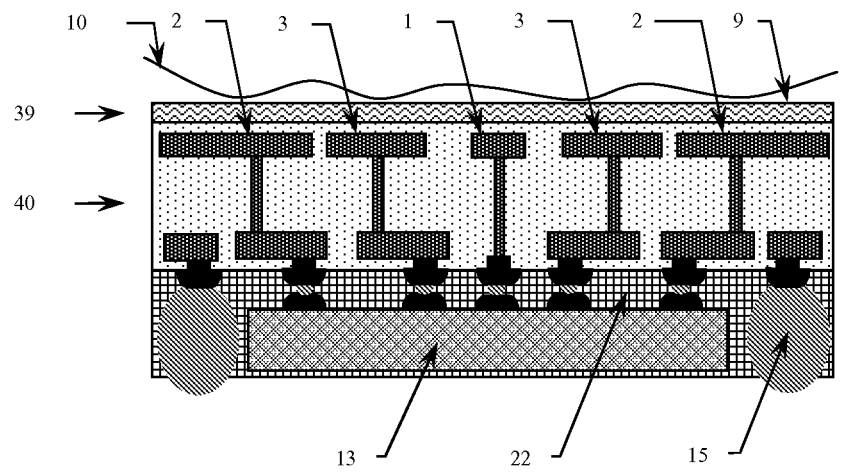
FIG. 6 illustrates the cross section of a fifth embodiment of the invention.

In the alternative embodiment in FIG. 6, a curable polymer resin 22, for example epoxy, is used to improve mechanical robustness of the sensor. The underfill resin is used to encapsulate electrical interfaces and the processing unit, hence protecting them from the elements such as moisture and dirt, while also adding stiffness to the sensor. A sheet with multiple sensors can be underfilled and coated before cutting into individual sensors. The finished product is a fingerprint device, encapsulated and packaged with a BGA type ball interface 15. A similar result may be achieved using plastic molding processes as opposed to curable resins.

Figure 7:
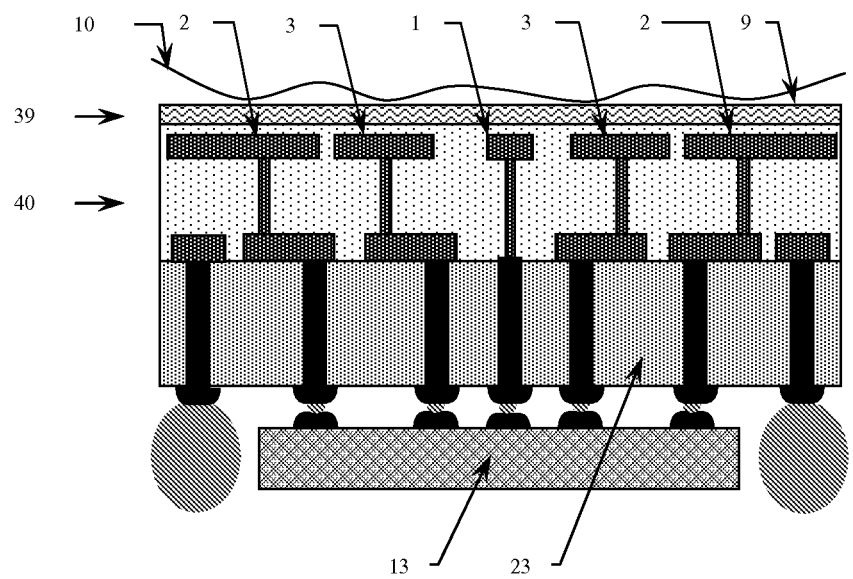
FIG. 7 illustrates the cross section of a sixth embodiment of the invention.

In the alternative embodiment in FIG. 7, an additional second dielectric material 23 is laminated onto the build-up substrate to improve stiffness and mechanical robustness of the sensor. This material may be a layer of liquid or dry film soldermask where the conductive sections are formed with the same process used to form the conductive sections of the build-up substrate. Alternatively the stiffening layer may be of a printed circuit board type material with preformed via's, interfaced and electrically connected to the build-up substrate conductive sections.

Figure 8:
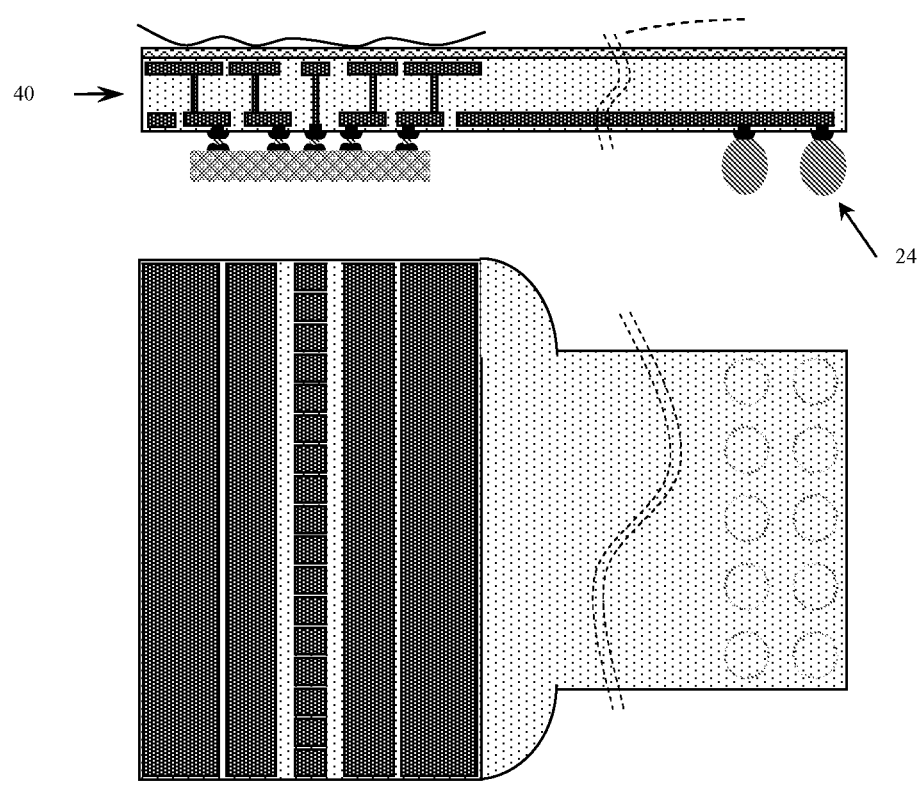
FIG. 8 illustrates the cross section and layout of a seventh embodiment of the invention.

In the alternative embodiment in FIG. 8, a flexible ribbon cable 24 is integrated in the build-up substrate for external IO connections. This may simplify integration into various applications with the option to increase the distance between the finger interface and host system electronics. The ribbon cable may for instance be threaded through a slot in the application enclosure.

Figure 9:
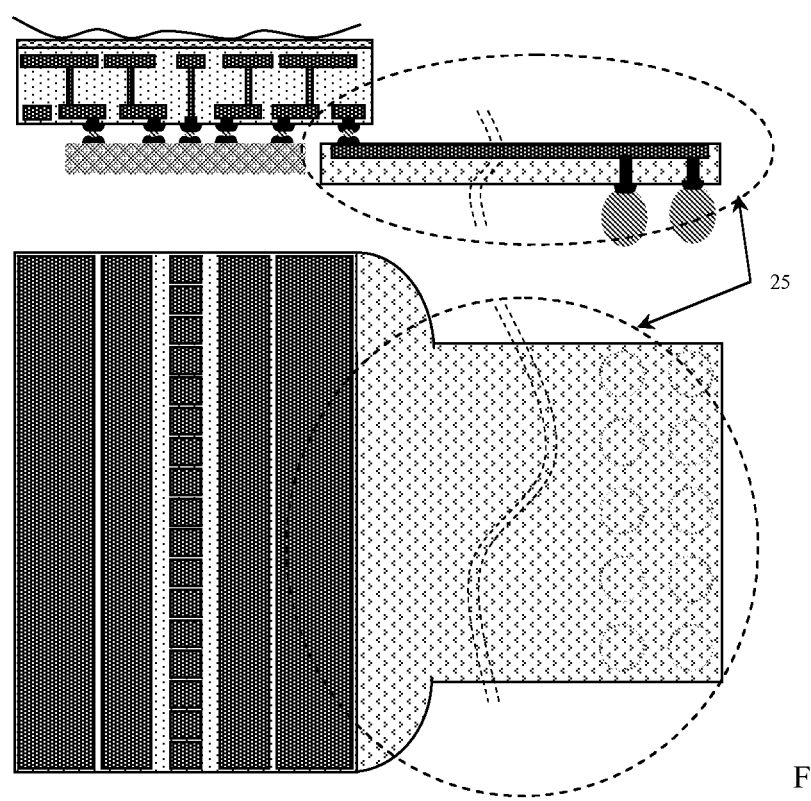
FIG. 9 illustrates the cross section and layout of an eighth embodiment of the invention.

In the alternative embodiment in FIG. 9, a separate flexible ribbon cable 25 is connected to the external IO connection interface of the build-up substrate yielding advantages similar to what is described for the embodiment in FIG. 8.

Figure 10:
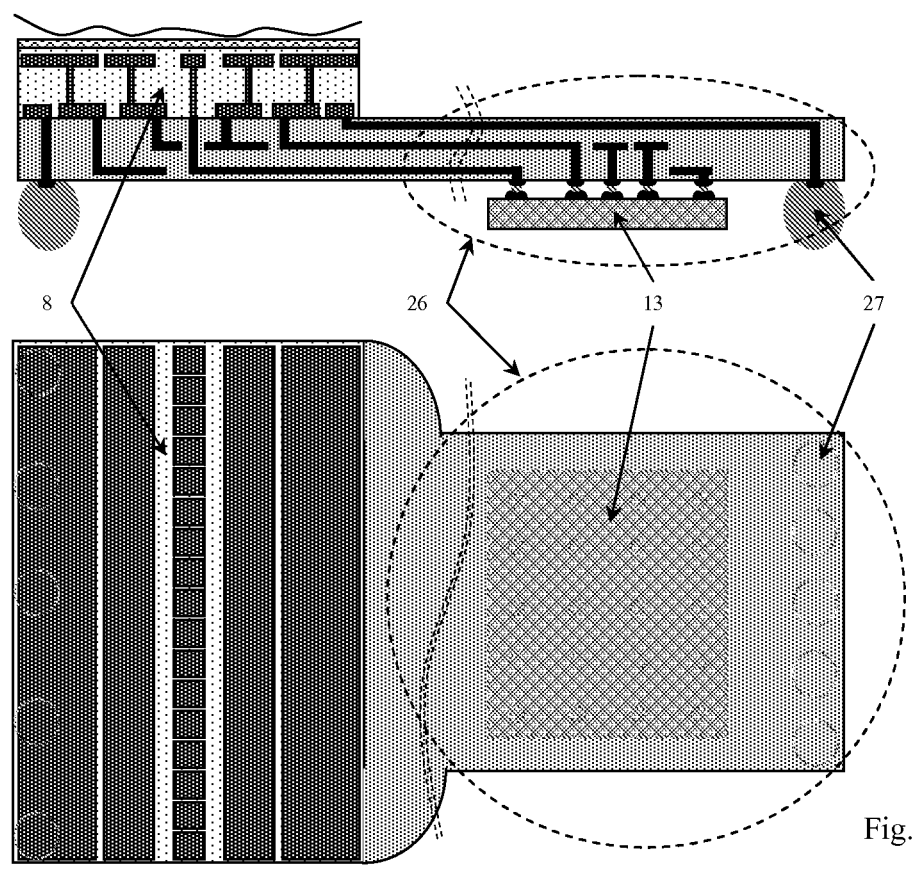
FIG. 10 illustrates the cross section and layout of a ninth embodiment of the invention.

In the alternative embodiment in FIG. 10 the high resolution build-up substrate 8 is laminated or otherwise fixed with electrical connections to a standard PCB or flexible printed circuit 26 constituting an interposer between the build-up sensor substrate and the signal processing unit 13. This may provide advantages in fixturing, interconnecting, and assembling while utilizing a lower cost material for circuitry requiring a larger area. The signal processing unit and external IO connections 27 may be located on either side of the interposer.

Figure 11:
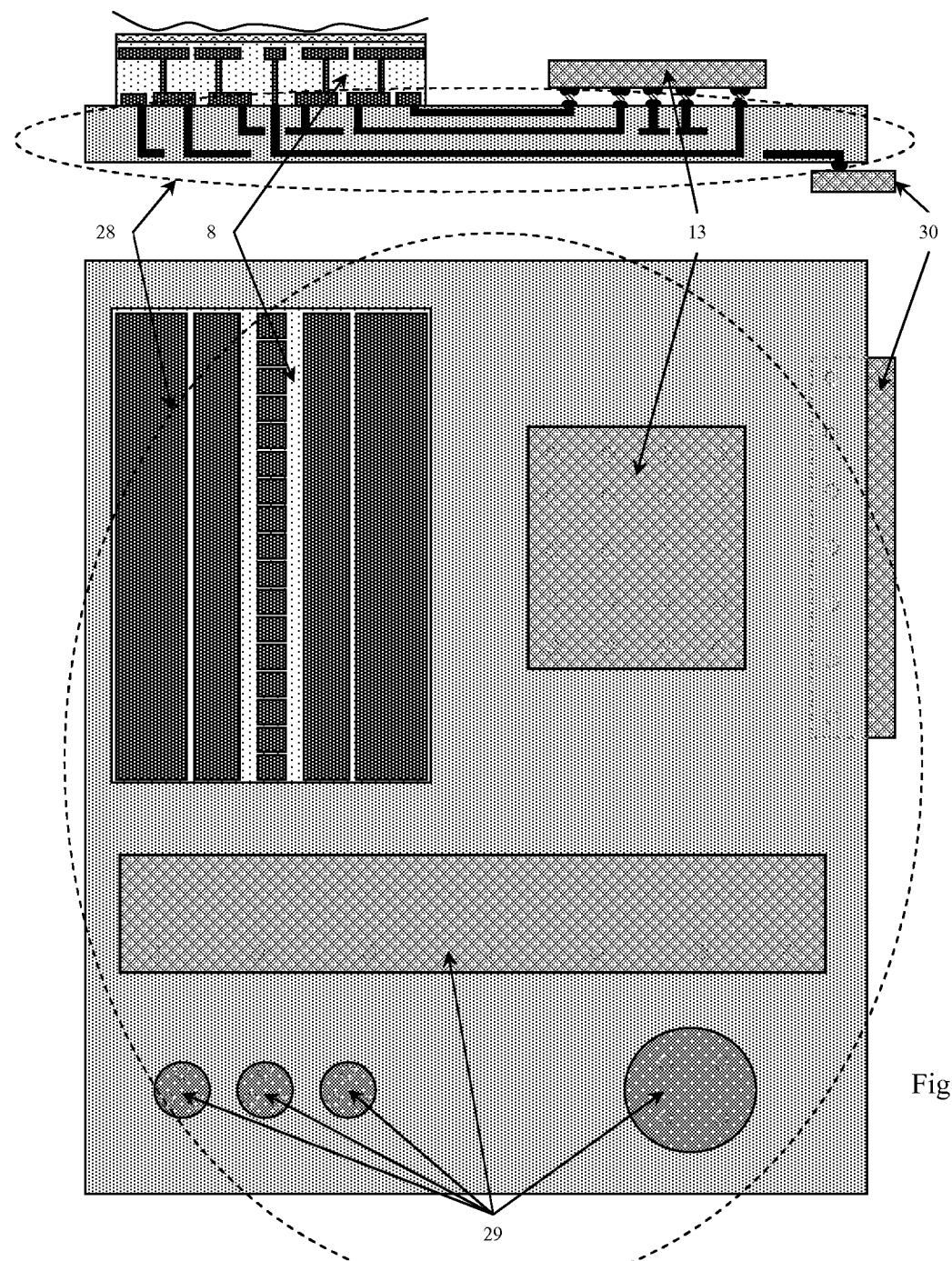
FIG. 11 illustrates the cross section and layout of a tenth embodiment of the invention.

In the alternative embodiment in FIG. 11 the high resolution build-up substrate 8 is laminated or otherwise fixed with electrical connections to a standard PCB or flexible printed circuit 28 constituting a motherboard for an embedded fingerprint module. Combining the high resolution build-up substrate with low cost standard circuit board technology additional electronic circuitry such as integrated circuits, displays, LED's, buttons 29, and external electrical interfaces 30 can be integrated into the fingerprint module. The additional electronic circuitry may be located on either side of the motherboard.

Figure 12:
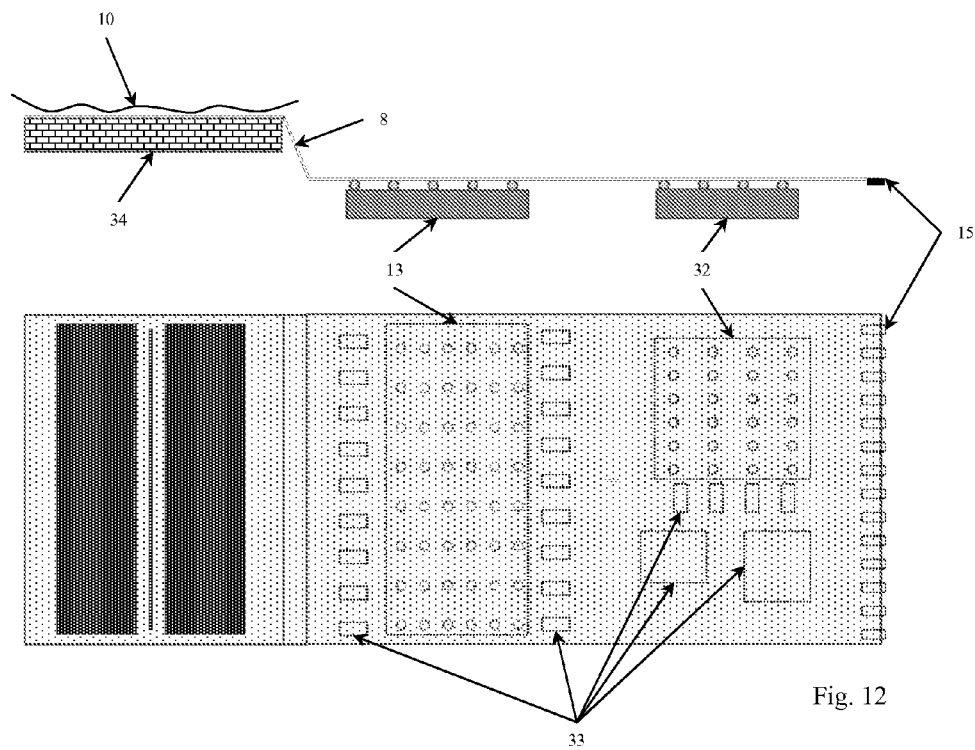
FIG. 12 illustrates the cross section and layout of an eleventh embodiment of the invention.

In the alternative embodiment in FIG. 12 the high resolution build-up substrate 8 is utilized not only as a sensor substrate, but is also implemented as a carrier and interconnect device for a full biometric system. $1^{st}$, $2^{nd}$ and $3^{rd}$ electrode signals are redistributed (not shown) to the signal processing unit 13 located either directly below the finger interface or shifted in any lateral direction. Additional integrated circuits such as micro controllers 32 and other electrical components 33 such as capacitors, resistors, buttons, displays and antennas may be integrated either by Flip Chip, wire bonding, conductive glue or other. External IO connections 15 may be integrated as exposed conductive pads, headers, and connectors or other. The finger interface section may be supported mechanically by a laminated stiffener plate 34 of suitable thickness and material. The complete biometric assembly may be mounted inside a suitable enclosure, or molded, alternatively laminated, inside for example an id or financial transaction card.

In FIGS. 13a and 13b the flexible unit 40 with the fingerprint sensor 21 is mounted on a second dielectric material 23 as in FIG. 7. This second dielectric unit 23 constitutes a circuit board including a bonding interface 41 to connect with the coupling points 31 on the back side of the fingerprint sensor 21 as well as conductor leads through the second dielectric unit to a solder surface 42 on the opposite side on which processors 13 may be placed, thus being connected to the fingerprint sensor 21. This solution is especially suitable for mounting in smart cards having an opening or recess adapted to receive the fingerprint sensor unit. The sensor unit may then be fastened in the recess or hole using lamination processes or adhesives and sealed to constitute an integral part of the smart card.

Smart cards are often made in a layered structure having at least three layers where the a middle layer includes conductor leads making it possible to connect to other circuitry in the card. An example showing this type of connection is shown in U.S. Pat. No. 6,881,605. As the fingerprint sensor is to be positioned in a recess or hole in the card contact points 43 in a position suitable for connecting to the conductive card layer are provided at a suitable position matching the thickness of the outer layers covering the electrical conductors in the card.

FIG. 14 illustrates the fingerprint sensor 21 positioned in a smart card 47 also comprising electrical conductors 44 as well as a microchip 45 and an antenna 46, e.g. for RFID or near field communication. As mentioned above these conductors 44 are embedded in an intermediate layer inside the smart card while the connector interface of the microchip 45 and fingerprint sensor 21 extend to the card surface.

Thus the invention refers especially to the realization of fingerprint sensors with sensor electrodes and associated conductive paths embedded in a dielectric substrate.

To summarize the invention relates to a sensor unit for measuring structures and properties by the surface of an object of organic tissue, especially a fingerprint sensor. The sensor unit comprising a contact surface adapted to have mechanical contact with said object, a first dielectric layer having a chosen thickness, a second layer including a number of electrically conductive first electrodes 1 having predetermined sizes and positions, the sensor elements being separated by a dielectric material, a third layer including a number of conductive sections, each having a first end galvanically coupled to first electrodes and a second end at the opposite side of the third layer having predetermined positions, the conductive sections being separated by a dielectric material, and electrically conductive connecting means at said predetermined positions of said second ends of the conductive sections for galvanic connection to a signal processing unit.

This way a substrate is provided for mounting of the processor unit where the substrate contains both the first electrodes in the predetermined pattern, and possibly additional electrodes, in a polymer material. The dielectric material preferably being polyimide and the sensor being built using a build-up process where the first layer is deposited as a liquid on a plane glass surface.

Thus the invention primarily relates to a sensor for detection of properties and structures of an organic tissue and its surface, especially a fingerprint sensor, the sensor surface being part of a flexible unit suitable to be included in credit card etc. The flexibility may thus preferably be according to the ISO standard for credit cards ISO-IEC 7810. The physical characteristics being tested with test procedures from ISO-IEC 10373-1 identification cards—Test methods. For other purposes the flexibility of the substrate layers without processors and other components may be larger, e.g. with a bend radius down to 1 mm. It comprises a chosen number of first electrodes or sensor elements at chosen positions for coupling to a surface to be measured. The size of the first electrodes and preferably the distances between them should be less or comparable to the size of the properties or structures in the tissue or its surface so as to be able to distinguish between different types of features such as ridges and valleys in a fingerprint. A processing unit may be included having electronic circuitry for detection of voltage at or the current flow in the electrodes, thereby providing for detection and collection of information of related capacitance, impedance, electromagnetic field, fingerprint, structure, tissue aliveness or other biometric, physical, physiological, thermal or optical characteristics or properties of the tissue or its surface. This circuitry is connected to said first electrodes for providing detection of said characteristics, properties or structures, the processing unit being mounted on one side of a substrate, and the first electrodes being positioned on internally embedded layers of said substrate. The substrate thus includes through going first conductive paths between said sensor electrode and said measurement circuitry, wherein the substrate is made from a flexible single or multi layer dielectric polymer material such as polyimide and said first conductive paths are constituted by through going substrate sections of a chosen size and material.

The substrate preferably is made from flexible materials and also includes at least one second electrode with a size substantially larger than the structures of the surface to be measured. The second electrode may be grounded or connected to said processing unit, with a second conductive path also being constituted by thru going conductive sections of the substrate, and the processing unit is adapted to detect the voltage or current at the first and second electrodes. In the preferred embodiment of the invention a varying voltage may be applied by the processing unit or an external oscillator between the second electrode and the first electrodes, the processing unit measuring or calculating the impedance between the first electrodes and the second electrode.

The substrate may also includes at least one third electrode, providing an electrode being coupled to said surface and connected to said processing unit, with a third conductive path also being constituted by thru going conductive leads of the substrate. The third electrode may be grounded or the processing unit may be adapted to detect the voltage or current at the third electrode.

The first, second and third electrodes may be embedded in the same plane or at varying depth, relative to the surface to be measured or completely exposed to the said surface, yielding individual dielectric coupling characteristics for said surface structure measurements. Thus the first layer may include areas with reduced thickness or openings over at least some of the electrodes thus also providing means for adjusting the capacitance between the finger and electrode or providing galvanic contact between the electrodes and the finger/object to be measured.

For protecting the sensor unit surface an outer protective layer made from a carbon based material, e.g. amorphous diamond, covering the measurement surface interface of the surface sensor.

The substrate may also include at least one external interface to an external electrode outside the substrate being substantially larger than the structures of the surface, providing an external electrode being coupled to said surface to be measured, and connected to said processing unit.

The third layer of the sensor unit may also include at least one embedded patternable sub-layer for signal redistribution purposes of said first, second or third conductive paths at predetermined positions of connection point for coupling to the processing unit. The sub-layer may also include embedded active and passive electronic devices, where at least one electronic devise is implemented between at least two conductive sections of said first, second or third conductive paths.

The processing unit with measurement circuitry connected to at least two conductive sections of said first, second or third conductive paths, may also be embedded into the substrate structure.

The substrate may also include at least one embedded organic electronics layer where at least one electronic device is implemented between at least two conductive sections of said first, second or third conductive paths, and or at least one embedded patternable dielectric layer where at lease one void is created to form a spark gap between at least two conductive sections of said first, second or third conductive paths.

As mentioned above referring to FIGS. 10-12 the coupling means provided for coupling to a signal processing unit may be connected to conductors on a flexible foil, PCB or printed circuit, where the conductors provide a connection between the coupling means and a corresponding interface on a signal processing unit positioned in a position laterally separated from the coupling means. This way the processing unit may be positioned in a different position than the sensor surface, either on the same side of the foil, PCB or printed circuit or on the opposite side. The printed circuit or PCB may also comprise other circuitry or interfaces to external equipment.

The sensor unit according to the invention is preferably produced using a method including the steps of:
 depositing liquid polyimide on a plane glass surface and hardening the polyimide material,
 depositing a second layer on said first layer by applying a pattern of electrically conductive material constituting first electrodes on the first layer and depositing a liquid polyimide layer thus providing an insulation between the first electrodes and hardening the polyimide material, and,
 depositing the third layer by applying a pattern of electrically conductive material and depositing a liquid polyimide layer thus providing an insulation between the first electrodes and hardening the polyimide material,
 and after curing the unit removing it from the glass plate thus producing a layered flexible film or foil.

This sequence may be performed in the opposite order thus leaving the glass plate on the opposite side of the foil, depending on the required accuracy of the process and positioning of the sensor electrodes.

The method may also include a step of applying an electrically conductive material on the second ends of the conductive sections for providing connecting means.

The surface of the sensor may be treated in several ways depending on the use and operating conditions. For example the substrate may be altered for optical properties by patterning and imaging polyimide structure for appearance, reflection etc, or for obtaining surface characteristics such as hydrophobicity, friction, resistance to wear etc.

The substrate may also be altered to accommodate an embedded processing unit, or coated with a hardened curing resin on the processing unit side to form an encapsulated device with a ball grid array type external IO interface. In order to make it more durable it may also be laminated onto another surface for added rigidity and interconnection purposes such as a printed circuit board.

For improving the coupling characteristics or, in case the surface to be measured is curved, the substrate may be lamination onto a curved surface, e.g. so as to obtain a solution similar to the swipe sensor described in U.S. Pat. No. 6,785,407.

An advantage with the present invention is that a flexible substrate may be obtained which may function as a part of a flexible ribbon cable for interconnection purposes, or be laminated onto a flexible flat cable for interconnection purposes. It may also laminated or otherwise electrically connected to a PCB or flexible circuit, constituting an interposer between said substrate and said processing unit for additional degrees of freedom in layout of assembly and interconnections or a motherboard for an embedded fingerprint module, providing an interface between said sensor substrate and processing unit, while allowing for additional electronic circuitry and components to be integrated.

The invention claimed is:

1. A sensor unit for measuring a surface of an object, the sensor unit comprising:
 a first dielectric layer;
 a signal processing unit;
 a second dielectric layer located between said first dielectric layer and said signal processing unit, the second dielectric layer having a first side that faces the first dielectric layer and a second side opposite the first side;
 a set of first electrodes having predetermined sizes and positions at the first side of the second dielectric layer;
 a set of second electrodes having predetermined sizes and positions at the first side of the second dielectric layer; and
 a plurality of conductive sections separated by dielectric material in said second dielectric layer, each of the plurality of conductive sections extending from the first side to the second side and having:
  a first end galvanically coupled to one of said first electrodes or to one of said second electrodes and
  a second end having one of a plurality of predetermined positions on the second side of said second dielectric layer; and
 electrically conductive components connected to said conductive sections at said predetermined positions of said second ends of the conductive sections, the electrically conductive components providing galvanic connection to the signal processing unit, wherein each of said electrically conductive components of a set of electrically conductive components that provide electrical connection for the second electrodes is offset, in a direction parallel to the first side or the second side of the second dielectric layer, from a center of a corresponding one of said second electrodes; and wherein said signal processing unit is adapted to detect a voltage or current at said first electrodes and second electrodes.

2. The sensor unit according to claim 1, wherein the dielectric material is polyimide.

3. The sensor unit according to claim 1, further comprising an additional layer comprising at least two sub-layers, wherein at least one of the two sub-layers comprises a pattern of additional conductive sections adapting the positions of the second ends of the plurality of conductive sections to positions of connection points of the signal processing unit.

4. The sensor unit according to claim 1, wherein at least one of said second electrodes has dimensions that are larger than dimensions of at least one of the first electrodes.

5. The sensor unit according to claim 4, wherein each of the second electrodes is provided with a connection point at the second side of the second dielectric layer for coupling to the processing unit.

6. The sensor unit according to claim 4, wherein the thickness of the first layer over at least one second electrode is reduced.

7. The sensor unit according to claim 1, wherein the first dielectric layer comprises openings over at least one of said electrodes providing galvanic contact between the electrode and the object.

8. The sensor unit according to claim 1, wherein said electrically conductive components are connected to conductors on a flexible printed circuit board (PCB) or printed circuit, the conductors providing a connection between the electrically conductive components and a corresponding interface on the signal processing unit, wherein the corresponding interface on the signal processing unit is offset from the electrically conductive components.

9. The sensor unit according to claim 8, wherein the signal processing unit is positioned on the same side of the flexible PCB or printed circuit relative to the electrically conductive components.

10. The sensor unit according to claim 8, wherein the signal processing unit is positioned on the opposite side of the flexible PCB or printed circuit relative to the electrically conductive components.

11. The sensor unit according to claim 8, wherein the flexible PCB or printed circuit comprises a number of components and a coupling interface to external equipment.

12. The sensor unit according to claim 1, wherein at least one of the first dielectric layer and the second dielectric layer is flexible.

13. A method for producing a sensor unit, comprising the steps of:
    depositing liquid polyimide on a plane glass surface and hardening the polyimide material to form a first layer;
    depositing a second layer on said first layer by:
        applying a pattern of electrically conductive material constituting first electrodes on the first layer and
        depositing additional liquid polyimide to provide insulation between the first electrodes and hardening the additional polyimide material;
    depositing a third layer by:
        applying a pattern of electrically conductive material constituting a number of conductors having one end electrically connected to said pattern of electrically conductive material in said second layer,
        depositing further additional liquid polyimide material to provide insulation between the number of conductors and
        hardening the further additional polyimide material; and
    removing the first layer, second layer, and third layer from said glass surface, so as to provide a contact surface at a surface of said first layer.

14. The method according to claim 13, including a step of applying an electrically conductive material to opposite ends of the number of conductors to form electrically conductive components for interfacing with a signal processing unit.

* * * * *